(12) United States Patent
Hanzawa

(10) Patent No.: US 10,910,430 B2
(45) Date of Patent: Feb. 2, 2021

(54) IMAGING DEVICE WITH OPENING PARTS FOR POWER AND SIGNAL PATHS

(71) Applicant: Sony Corporation, Tokyo (JP)

(72) Inventor: Katsuhiko Hanzawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 110 days.

(21) Appl. No.: 16/306,275

(22) PCT Filed: Feb. 22, 2017

(86) PCT No.: PCT/JP2017/006540
§ 371 (c)(1),
(2) Date: Nov. 30, 2018

(87) PCT Pub. No.: WO2017/212693
PCT Pub. Date: Dec. 14, 2017

(65) Prior Publication Data
US 2019/0252448 A1    Aug. 15, 2019

(30) Foreign Application Priority Data

Jun. 8, 2016    (JP) .................................. 2016-114265

(51) Int. Cl.
*H01L 27/146* (2006.01)
*H04N 5/378* (2011.01)
(Continued)

(52) U.S. Cl.
CPC ...... *H01L 27/14643* (2013.01); *H01L 27/146* (2013.01); *H01L 27/14612* (2013.01);
(Continued)

(58) Field of Classification Search
CPC ............ H01L 27/146; H01L 27/14643; H04N 5/3741; H04N 5/3745; H04N 5/37457; H04N 5/378; H04N 5/379
(Continued)

(56) References Cited

U.S. PATENT DOCUMENTS 9,979,916 B2 * 5/2018 Hiyama ............. H04N 5/37457
2005/0185077 A1    8/2005 Xiao
(Continued)

FOREIGN PATENT DOCUMENTS

EP    1 885 117 A2    2/2008
EP    2 234 387 A1    9/2010
(Continued)

OTHER PUBLICATIONS

Extended European Search Report dated Jul. 12, 2019 in connection with European Application No. 17809877.8.
(Continued)

*Primary Examiner* — Que Tan Le
(74) *Attorney, Agent, or Firm* — Wolf, Greenfield & Sacks, P.C.

(57) ABSTRACT

A plurality of circuits are each connected with one of a plurality of power supply lines disposed in a direction perpendicular to a predetermined direction. A signal processing part processes a pixel signal that is output via a signal line commonly connected with a predetermined number of adjacent pixel circuits in the predetermined direction from among a plurality of pixel circuits. A power path opening/closing part opens and closes a path between each of the plurality of power supply lines and a power supply. A common path opening/closing part opens and closes a path between each of the plurality of power supply lines and the signal line.

11 Claims, 16 Drawing Sheets

(51) Int. Cl.
*H04N 5/369* (2011.01)
*H04N 5/374* (2011.01)
*H04N 5/3745* (2011.01)

(52) U.S. Cl.
CPC ............. *H04N 5/369* (2013.01); *H04N 5/378* (2013.01); *H04N 5/379* (2018.08); *H04N 5/3741* (2013.01); *H04N 5/3745* (2013.01); *H04N 5/37457* (2013.01)

(58) Field of Classification Search
USPC .......................................... 250/208.1, 214 R
See application file for complete search history.

(56) References Cited

U.S. PATENT DOCUMENTS

2010/0182472 A1    7/2010   Yamagata et al.
2010/0259662 A1   10/2010   Oike et al.

FOREIGN PATENT DOCUMENTS

| | | |
|---|---|---|
| JP | 2005-245955 A | 9/2005 |
| JP | 2010-171521 A | 8/2010 |
| JP | 2010-245955 A | 10/2010 |
| JP | 2013-232717 A | 11/2013 |
| WO | WO 2012/144218 A1 | 10/2012 |

OTHER PUBLICATIONS

Written Opinion and English translation therof dated May 16, 2017, in connection with International Application No. PCT/JP2017/006540.

International Preliminary Report on Patentability and English translation therof dated Dec. 20, 2018 in connection with International Application No. PCT/JP2017/006540.

International Search Report and English translation thereof dated May 16, 2017 in connection with International Application No. PCT/JP2017/006540.

Chinese Office Action dated Jul. 30, 2020 in connection with Chinese Application No. 201780030114.2, and English translation thereof.

Communication pursuant to Article 94(3) EPC dated Sep. 1, 2020 in connection with European Application No. 17809877.8.

* cited by examiner

IMAGING DEVICE WITH OPENING PARTS FOR POWER AND SIGNAL PATHS

CROSS-REFERENCE TO RELATED APPLICATIONS

This is a U.S. National Stage Application under 35 U.S.C. § 371, based on International Application No. PCT/JP2017/006540, filed in the Japanese Patent Office as a Receiving Office on Feb. 22, 2017, which claims priority to Japanese Patent Application Number JP2016-114265, filed in the Japanese Patent Office on Jun. 8, 2016, each of which is hereby incorporated by reference in its entirety.

TECHNICAL FIELD

The present technology relates to a solid-state imaging device, an imaging apparatus, and a method of controlling a solid-state imaging device. More particularly, the technology relates to a solid-state imaging device having one ADC (Analog to Digital Converter) shared by a plurality of columns, an imaging apparatus, and a method of controlling the solid-state imaging device.

BACKGROUND ART

Heretofore, a column ADC method by which an ADC is arranged for each column has been extensively adopted for solid-state imaging devices. According to the column ADC method, it becomes more difficult to arrange an ADC for each column as pixels are more and more miniaturized. As one countermeasure against this difficulty, there has been proposed a solid-state imaging device in which an ADC is arranged for every three columns and one ADC is shared by adjacent three columns (e.g., see PTL 1).

CITATION LIST

Patent Literature

[PTL 1]
 JP 2013-232717 A

SUMMARY

Technical Problem

The above-mentioned existing technique involves disposing three selection lines per row to transmit selection signals so that three columns are selected one after another for output of a pixel signal to the ADC. However, the configuration of disposing three selection lines per row increases the number of lines within a pixel array in comparison with a case of disposing one selection line per row, which is problematic. Because an increasing number of lines in the pixel array can make miniaturization of the pixels difficult, it is desirable to reduce the number of lines.

The present technology has been devised in view of the above circumstances. An object of the technology is to reduce the number of lines in the pixel array of a solid-state imaging device in which one ADC is shared by a plurality of columns.

Solution to Problem

The present technology has been devised to solve the above problem. According to a first aspect of the present technology, there are provided a solid-state imaging device and a method of controlling a solid-state imaging device. The solid-state imaging device includes a plurality of pixel circuits each connected with one of a plurality of power supply lines disposed in a direction perpendicular to a predetermined direction, a signal processing part processing a pixel signal that is output via a signal line commonly connected with a predetermined number of adjacent pixel circuits in the predetermined direction from among the plurality of pixel circuits, a power path opening/closing part opening and closing a path between each of the plurality of power supply lines and a power supply, and a signal path opening/closing part opening and closing a path between each of the plurality of power supply lines and the signal line. This provides an effect of individually opening and closing the path between each of the plurality of power supply lines and the power supply and the path between each of the plurality of power supply lines and the signal line.

Also, according to the first aspect of the present technology, there may be further included a scanning circuit performing a process of driving the pixel circuits arrayed in the predetermined direction to output the pixel signal and a process of selecting the predetermined number of pixel circuits one after another. This provides an effect of driving the pixels arrayed in the predetermined direction and selecting the predetermined number of pixel circuits one after another.

Also, according to the first aspect of the present technology, the power path opening/closing part may perform control to bring into a closed state the path between the power supply line connected with the selected pixel circuit from among the plurality of power lines, and the power supply, and the signal path opening/closing part may perform control to bring into an opened state the path between the power supply line connected with the selected pixel circuit from among the plurality of power supply lines, and the signal line. This provides an effect of bringing into the closed state the path between the power supply line connected with the selected pixel circuit and the power supply, and bringing into the opened state the path between the power supply line connected with the selected pixel circuit and the signal line.

Also, according to the first aspect of the present technology, the plurality of power supply lines, the plurality of pixel circuits, and the signal line may be arranged on a predetermined semiconductor substrate, and the signal processing part may be arranged on a semiconductor substrate layered on the predetermined semiconductor substrate. This provides an effect of having the pixel signal processed on the layered semiconductor substrate.

Also, according to the first aspect of the present technology, the power path opening/closing part and the signal path opening/closing part may be arranged on the layered semiconductor substrate. This provides an effect of individually opening and closing the path between each of the plurality of power supply lines and the power supply and the path between each of the plurality of power supply lines and the signal line on the layered semiconductor substrate.

Also, according to the first aspect of the present technology, the power path opening/closing part and the signal path opening/closing part may be arranged on the predetermined semiconductor substrate. This provides an effect of individually opening and closing the path between each of the plurality of power supply lines and the power supply and the path between each of the plurality of power supply lines and the signal line on the layered semiconductor substrate.

Also, according to the first aspect of the present technology, a certain number of adjacent pixel circuits from among the plurality of pixel circuits may share a floating diffusion layer, the floating diffusion layer may accumulate photoelectrically converted electrical charges to generate a voltage reflecting an amount of the electrical charges, and the pixel signal may be a signal that reflects the voltage. This provides an effect of having the pixel signal generated by the pixel circuits sharing the floating diffusion layer.

Also, according to the first aspect of the present technology, the plurality of pixel circuits may each include a photoelectric conversion element converting light into electrical charges, a floating diffusion layer accumulating the electrical charges to generate a voltage reflecting an amount of the electrical charges, a reset transistor initializing the amount of the electrical charges accumulated in the floating diffusion layer, and an amplification transistor outputting a signal reflecting the voltage as the pixel signal. The amplification transistor may be connected with the power supply, and the reset transistor may be connected with a reset power supply different from the power supply. This provides an effect of having the pixel signal generated by the pixel circuits for which the reset power supply is separately provided.

Also, according to the first aspect of the present technology, the signal processing part may perform analog-to-digital conversion on the pixel signal. This provides an effect of converting the pixel signal into a digital signal.

Also, according to a second aspect of the present technology, there is provided an imaging apparatus including a plurality of pixel circuits each connected with one of a plurality of power supply lines disposed in a direction perpendicular to a predetermined direction, a signal processing part processing a pixel signal that is output via a signal line commonly connected with a predetermined number of adjacent pixel circuits in the predetermined direction from among the plurality of pixel circuits, a power path opening/closing part opening and closing a path between each of the plurality of power supply lines and a power supply, a signal path opening/closing part opening and closing a path between each of the plurality of power supply lines and the signal line, and a recording part recording image data generated from the processed pixel signal. This provides an effect of individually opening and closing the path between each of the plurality of power supply lines and the power supply and the path between each of the plurality of power supply lines and the signal line, and recording the image data.

Advantageous Effect of Invention

The present technology has an advantageous effect of reducing the number of lines in the pixel array of a solid-state imaging device in which one ADC is shared by a plurality of columns. Note that the advantageous effect stated in this description is not necessarily limitative, but there may be provided other advantageous effects stated in the present disclosure.

DESCRIPTION OF EMBODIMENTS

Modes for implementing the present technology (referred to as embodiments) will be described below. Description will be given in the following order:

1. First Embodiment (an example in which a power path and a signal path are opened and closed)
2. Second Embodiment (an example in which a power path and a signal path in solid-state imaging device having a multilayer-structure are opened and closed)
3. Third Embodiment (an example in which a floating diffusion layer is shared by two pixels and a power path and a signal path are opened and closed)

1. First Embodiment

[Typical Configuration of Imaging Apparatus]

Figure 1:
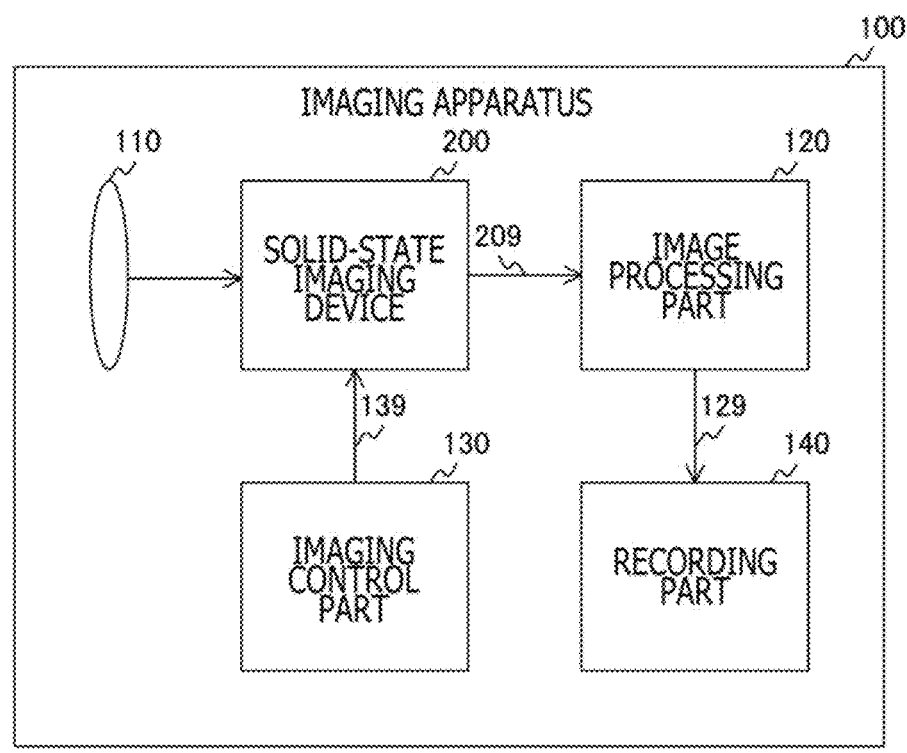
FIG. 1 is a block diagram depicting a typical configuration of an imaging apparatus in a first embodiment of the present technology.

FIG. 1 is a block diagram depicting a typical configuration of an imaging apparatus 100 in a first embodiment. The imaging apparatus 100 capturing image data includes an imaging lens 110, a solid-state imaging device 200, an image processing part 120, an imaging control part 130, and a recording part 140. An action camera or a vehicle-mounted camera, for example, may be considered to be the imaging apparatus 100.

The imaging lens 110 focuses and guides light onto the solid-state imaging device 200. The solid-state imaging device 200 generates image data under control of the imaging control part 130. The solid-state imaging device 200 supplies the image data to the image processing part 120 via a signal line 209.

The image processing part 120 performs various types of image processing such as demosaicing and white balance adjustment on the image data. The image processing part 120 supplies the image data thus processed to the recording part 140 via a signal line 129. The recording part 140 records the image data. Note that the image processing part 120, arranged outside the solid-state imaging device 200 in this example, may alternatively be disposed inside.

The imaging control part 130 provides overall control of the imaging apparatus 100. The imaging control part 130 supplies a vertical synchronization signal indicative of imaging timing, or the like, to the solid-state imaging device 200 via a signal line 139.

Note that the imaging lens 110, the solid-state imaging device 200, the image processing part 120, the imaging control part 130, and the recording part 140, all arranged in the same apparatus in this example, may alternatively be arranged in a plurality of apparatuses in a distributed manner. For example, the imaging lens 110 may be arranged in a lens unit, the solid-state imaging device 200 in the imaging apparatus 100, and the image processing part 120 in an information processing apparatus.

[Typical Configuration of Solid-State Imaging Device]

Figure 2:
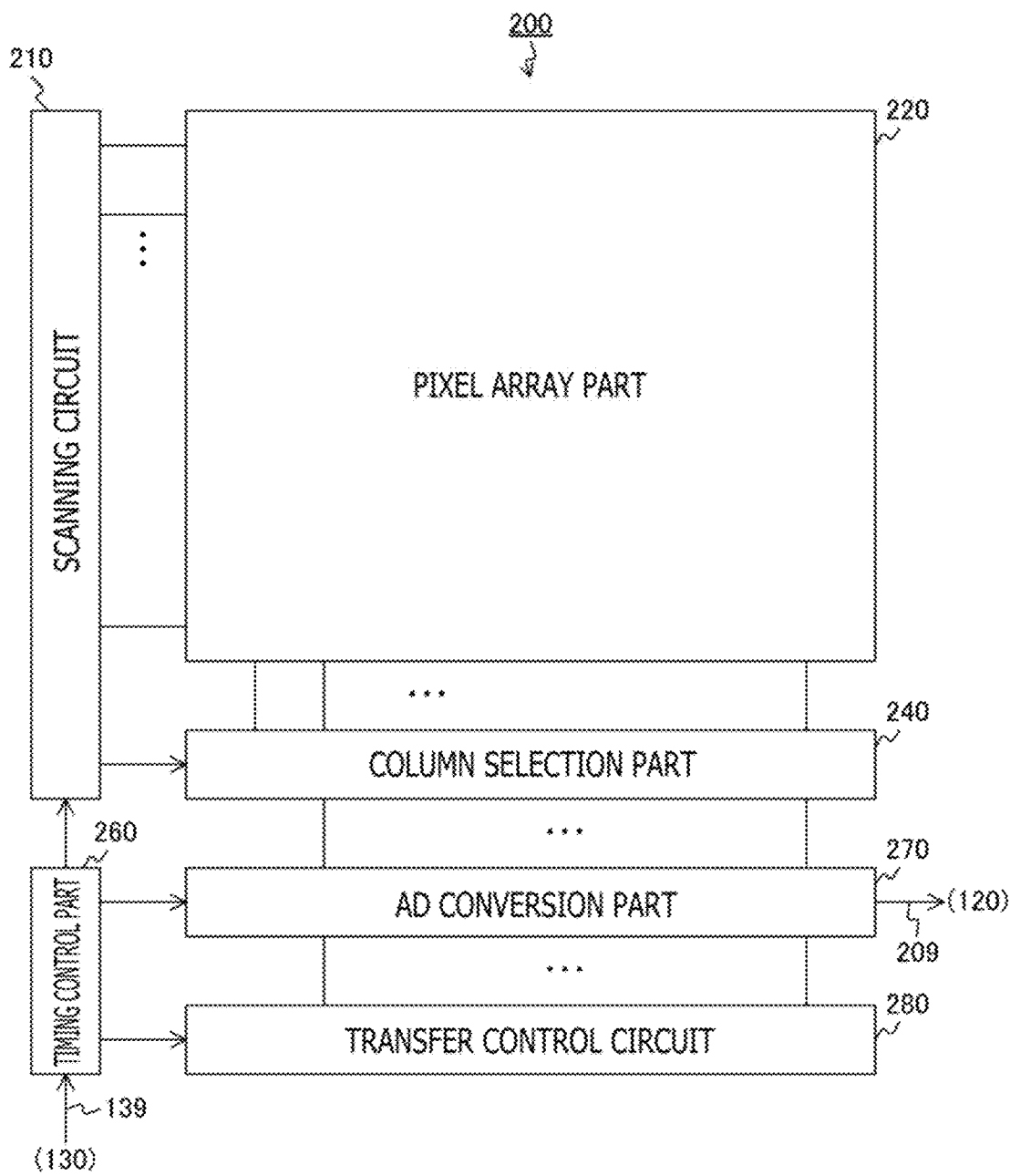
FIG. 2 is a block diagram depicting a typical configuration of a solid-state imaging device in the first embodiment of the present technology.

FIG. 2 is a block diagram depicting a typical configuration of the solid-state imaging device 200 in the first embodiment. The solid-state imaging device 200 includes a scanning circuit 210, a pixel array part 220, a column selection part 240, a timing control part 260, an AD conversion part 270, and a transfer control circuit 280. Also, the circuits in the solid-state imaging device 200 are each arranged on a single semiconductor substrate.

Also, the pixel array part 220 has a plurality of pixel circuits provided in a two-dimensional grid-like pattern. In the following description, an aggregate of pixel circuits arrayed in a given direction (e.g., in a horizontal direction) will be referred to as "rows," and an aggregate of pixel circuits arrayed in a direction perpendicular to the rows as "columns."

The scanning circuit 210 drives the pixel circuits to output pixel signals therefrom. The scanning circuit 210 selects the row to which the pixel circuit of a readout target belongs, and supplies a row selection signal indicative of the row to the pixel array part 220. Also, the scanning circuit 210 selects the column to which the pixel circuit of the readout target belongs, and supplies a column selection signal indicative of the column to the column selection part 240.

The column selection part 240 supplies the AD conversion part 270 with an analog pixel signal coming from the column selectively designated by the column selection signal from among all columns.

The timing control part 260 controls a timing at which each of the scanning circuit 210, the AD conversion part 270, and the transfer control circuit 280 operates. The AD conversion part 270 generates image data by performing AD conversion on the pixel signal coming from the column selection part 240. The transfer control circuit 280 controls the AD conversion part 270 to transfer the image data to the image processing part 120.

[Typical Configuration of Pixel Array Part]

Figure 3:
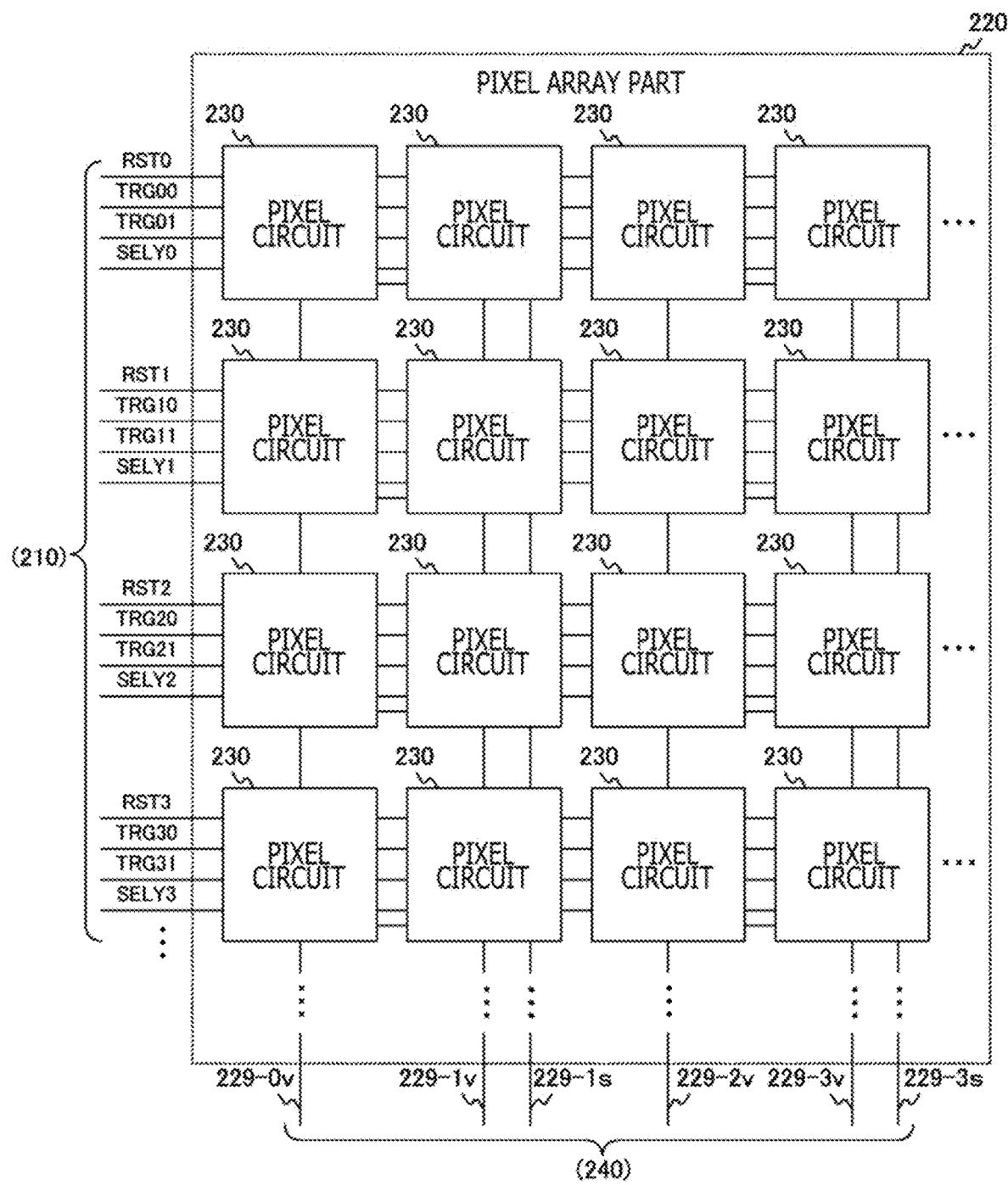
FIG. 3 is a block diagram depicting a typical configuration of a pixel array part in the first embodiment of the present technology.

FIG. 3 is a block diagram depicting a typical configuration of the pixel array part 220 in the first embodiment. The pixel array part 220 has pixel circuits 230 arrayed in a two-dimensional grid-like pattern. It is assumed that N denotes the number of rows (N is an integer of at least 2) in the pixel array part 220 and that M represents the number of columns therein (M is an integer of at least 2). Also, four horizontal signal lines are disposed per row along the horizontal direction, and one power supply line 229-$mv$ (m is an integer of 0 to M−1) is disposed per column along a vertical direction. Of the four horizontal signal lines corresponding to each row, one horizontal signal line is a reset line that transmits a reset signal, two horizontal signal lines are transfer lines that transfer a transfer signal, and the remaining one horizontal signal line is a selection line that transmits a row selection signal. The reset signal and the transfer signal will be discussed later in detail. Also, each even-numbered column is disposed with a single vertical signal line 229-$ms$ in the vertical direction.

It is also assumed that RSTn denotes a reset signal corresponding to row n (n is an integer of 0 to N−1) and that SELYn represents a row selection signal corresponding to row n. Also, in a block formed by N×2 pixel circuits 230, the pixel circuits 230 on the left of row 0 are supplied with a transfer signal TRG00, and the pixel circuits 230 on the right of row 0 are supplied with a transfer signal TRG01. In this block, the pixel circuits 230 on the left of row 1 are supplied with a transfer signal TRG10, and the pixel circuits 230 on the right of row 1 are supplied with a transfer signal TRG11. Further, the pixel circuits 230 on the left of row 2 immediately below row 1 are supplied with a transfer signal TRG20, and the pixel circuits 230 on the right of row 2 are supplied with a transfer signal TRG23. The row numbers of the transfer signals are thus changed successively. The number of transfer signals TRG is dependent on the number of columns in the block. In the case of N×2 columns, the transfer signals are TRG0 and TRGn1 per row. In the case of N×3 columns, the transfer signals are TRGn0, TRGn1, and TRGn2 per row.

Figure 4:
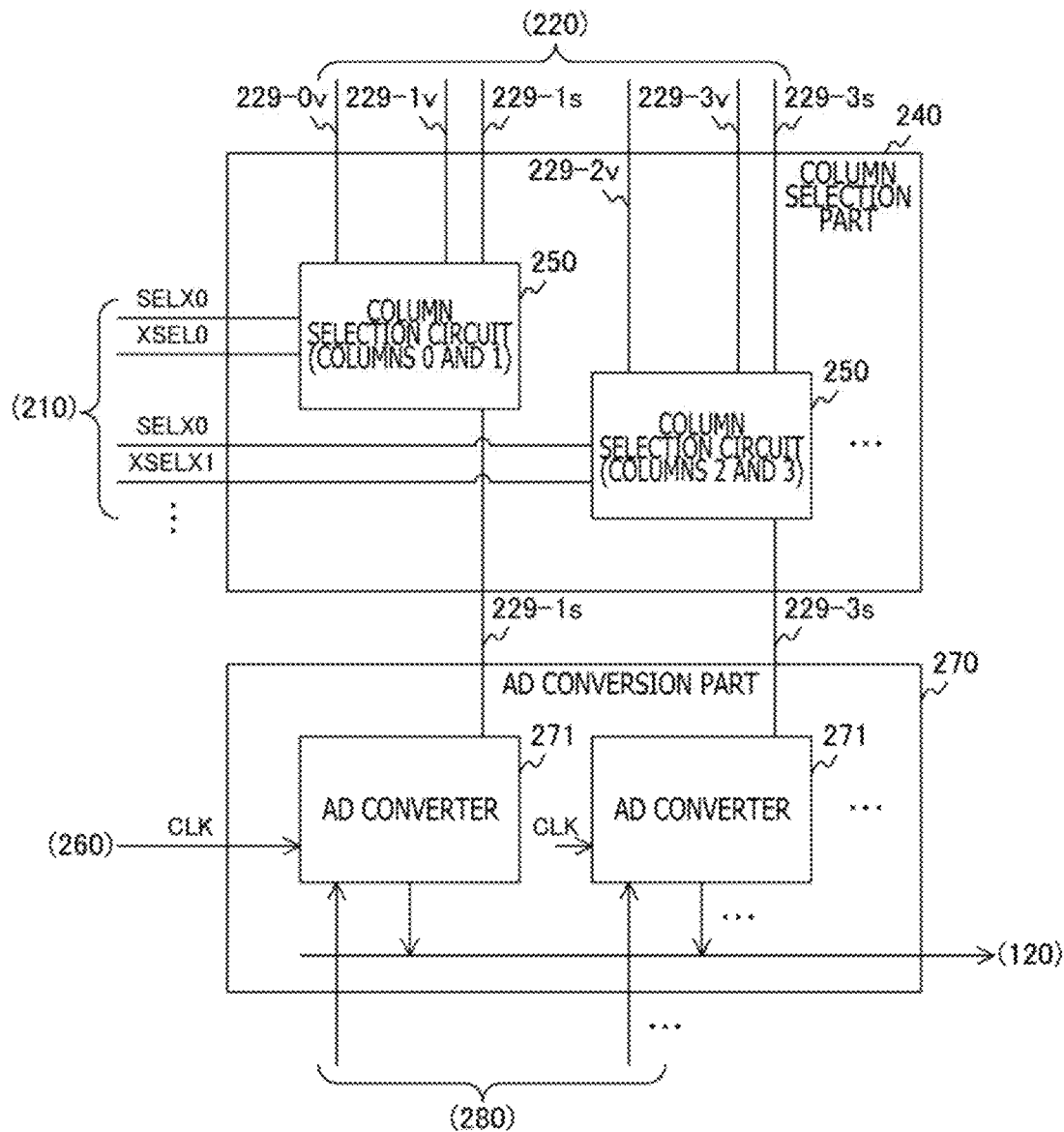
FIG. 4 is a block diagram depicting a typical configuration of a column selection part and an AD (Analog to Digital) conversion part in the first embodiment of the present technology.

FIG. 4 is a block diagram depicting a typical configuration of the column selection part 240 and the AD conversion part 270 in the first embodiment. The column selection part 240 includes as many column selection circuits 250 as the number of vertical signal lines 229-$ms$. Because the vertical signal lines 229-$ms$ are disposed only for the even-numbered columns as mentioned above, the number of column selection circuits 250 is half the number of columns. Each column selection circuit 250 is connected with the vertical signal lines 229-$ms$ that are different from each other. Also, the column selection part 240 supplies the AD conversion part 270 with the pixel signal coming from either an odd-numbered column or an even-numbered column designated by the column selection signal.

The AD conversion part 270 includes as many AD converters 271 as the number of vertical signal lines 229-$ms$. Because the vertical signal lines 229-$ms$ are disposed only for the even-numbered columns as mentioned above, the number of AD converters 271 is half the number of columns. Note that, in a case where one AD converter 271 is shared by as many as S adjacent columns, S being at least three, the number of AD converters 271 is 1/S of the total number of columns.

Each AD converter 271 is connected with each of the column selection circuits 250 that are different from one another. The AD converter 271 receives an analog pixel signal from the connected column selection circuit 250, and converts the pixel signal into digital pixel data in synchronism with a clock signal CLK from the timing control part 260. The AD converter 271 then transfers the pixel data to the image processing part 120 under control of the transfer control circuit 280.

Note that, although the AD converters 271 perform only AD conversion in this example, they may perform processes other than AD conversion as long as the processes amount to signal processing. For example, the AD converters 271 may further carry out CDS (Correlated Double Sampling). Note that the AD converter 271 is an example of the signal processing part stated in the appended claims.

[Typical Configuration of Pixel Circuits and Column Selection Circuits]

Figure 5:
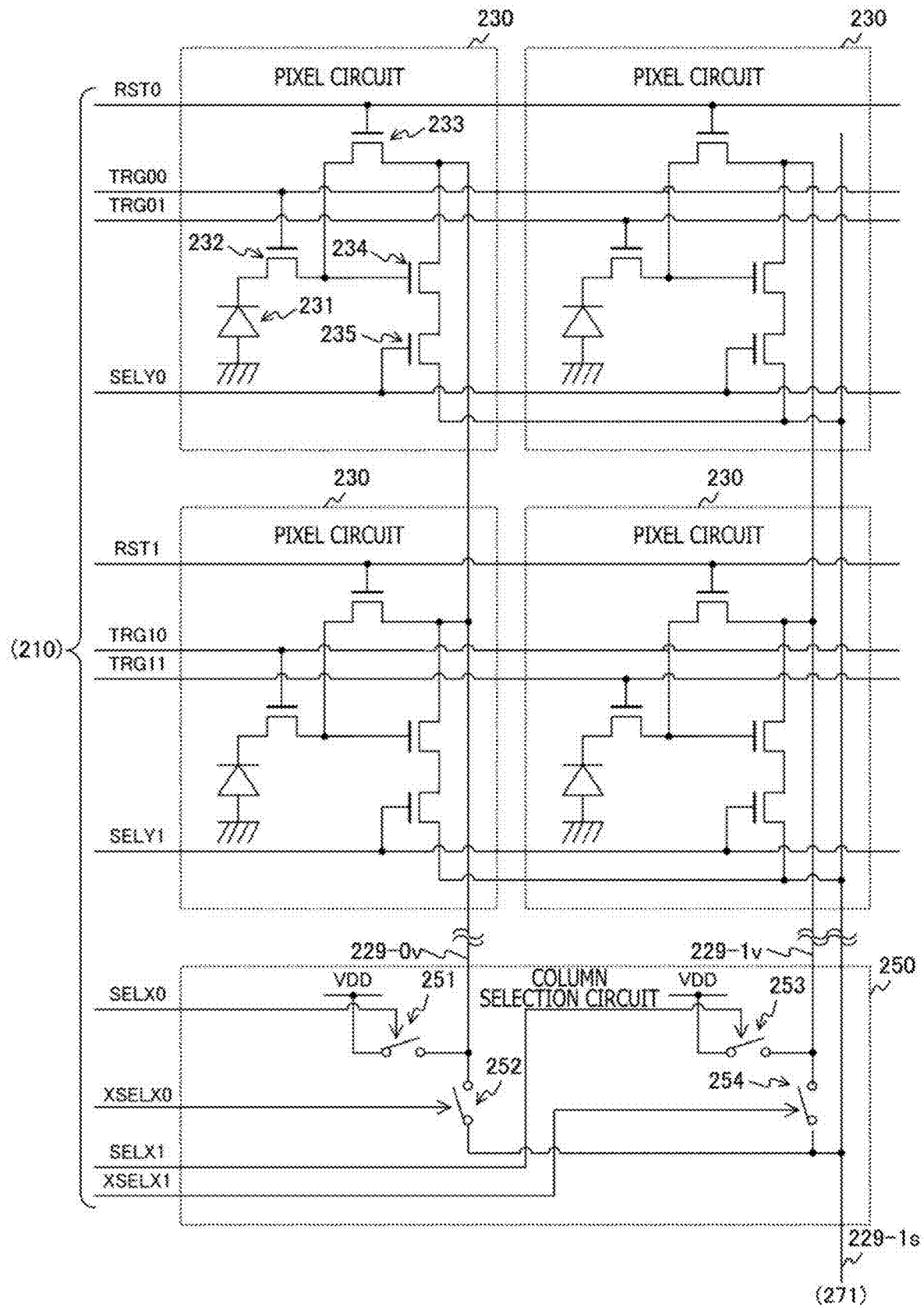
FIG. 5 is a circuit diagram depicting a typical configuration of pixel circuits and a column selection circuit in the first embodiment of the present technology.

FIG. 5 is a circuit diagram depicting a typical configuration of the pixel circuits 230 and the column selection circuit 250 in the first embodiment. The pixel circuit 230 includes a photoelectric conversion element 231, a transfer transistor 232, a reset transistor 233, an amplification transistor 234, and a selection transistor 235. The column selection circuit 250 includes switches 251, 252, 253 and 254. The transfer transistor 232, the reset transistor 233, the amplification transistor 234, and the selection transistor 235 may be N-type MOS (Metal Oxide Semiconductor) transistors, for example.

The photoelectric conversion element 231 photoelectrically converts incident light to generate electrical charges. The transfer transistor 232 transfers the electrical charges from the photoelectric conversion element 231 to a floating diffusion layer (not illustrated) in accordance with a transfer signal from the scanning circuit 210. Here, the transfer signal is a signal that designates transfer of electrical charges. Also, the pixel array part 220 is divided into unit pixel blocks each formed by N×2 pixel circuits 230. In the pixel block, the pixel circuits 230 on the left of row 0 are supplied with a transfer signal TRG00, and the pixel circuits 230 on the right of row 0 are supplied with a transfer signal TRG01. Also, in the pixel block, the pixel circuits 230 on the left of row 1 are supplied with a transfer signal TRG10, and the pixel circuits 230 on the right of row 1 are supplied with a transfer signal TRG11. In the following, likewise, the pixel circuits 230 on the left of row n are supplied with the transfer signal TRGn0, and the pixel circuits 230 on the right of row n are supplied with the transfer signal TRGn1, and so on.

The reset transistor 233 initializes the electrical charges of the floating diffusion layer in accordance with a reset signal RSTn from the scanning circuit 210. Here, the reset signal RSTn is a signal that designates initialization of the electrical charges accumulated in the floating diffusion layer of row n. Also, the floating diffusion layer accumulates electrical charges to generate a voltage reflecting the charge amount.

The amplification transistor 234 amplifies the voltage of the floating diffusion layer. The amplification transistor 234 outputs to the selection transistor 235 a pixel signal reflecting the voltage of the floating diffusion layer. Also, the amplification transistor 234 and the reset transistor 233 disposed for column m are connected with the power supply line 229-*mv*. This allows the power supplied to the amplification transistor 234 to be used as a reset power supply for initializing the floating diffusion layer.

The selection transistor 235 outputs the pixel signal to the vertical signal line 229-*ms* in accordance with the row selection signal SELYn. The selection transistor 235 of an odd-numbered column and the selection transistor 235 of an even-numbered column are commonly connected to the vertical signal line 229-*ms* of the even-numbered column.

The switch 251 opens and closes a path between the power supply line 229-*mv* (e.g., 229-0*v*) of an odd-numbered column and a power supply voltage VDD in accordance with a column selection signal SELXm from the scanning circuit 210. For example, in a case where a column selection signal SELYm is High, the switch 251 transitions to a closed state. In a case where the column selection signal SELYm is Low, the switch 251 transitions to an opened state.

The switch 252 opens and closes a path between the power supply line 229-*mv* (e.g., 229-0*v*) of an odd-numbered column and the vertical signal line 229-*ms* (e.g., 229-1*s*) in accordance with a column selection signal XSELXm from the scanning circuit 210. Here, the column selection signal XSELXm is an inverted version of the column selection signal SELXm. For example, in a case where the column selection signal XSELXm is High, the switch 252 transitions to a closed state. In a case where the column selection signal XSELXm is Low, the switch 252 transitions to an opened state.

The switch 253 opens and closes a path between the power supply line 229-*mv* (e.g., 229-1*v*) of an even-numbered column and the power supply voltage VDD in accordance with the column selection signal SELXm from the scanning circuit 210. The switch 254 opens and closes a path between the power supply line 229-*mv* (e.g., 229-1*v*) of an even-numbered column and the vertical signal line 229-*ms* (e.g., 229-1*s*) in accordance with the column selection signal XSELXm from the scanning circuit 210.

Note that the switches 251 and 253 are examples of the power path opening/closing part stated in the appended claims. Also, the switches 252 and 254 are examples of the signal path opening/closing part stated in the appended claims. Also, the vertical signal line 229-*ms* is an example of the signal line stated in the appended claims.

In the above-described configuration, one AD converter 271 is commonly connected with two adjacent columns via the vertical signal line 229-*ms*. The scanning circuit 210 drives the pixel circuits 230 individually using the row selection signal SELYn and the column selection signal SELXm. For example, the scanning circuit 210 drives the pixel circuit 230 of row n, column m by supplying a High-level row selection signal SELYn and a High-level column selection signal SELXm.

Here, consider a comparative example in which one AD converter 271 is shared by two adjacent columns and each row is provided with two selection lines and in which the scanning circuit 210 selects the columns one after another. In this comparative example in which the pixel circuits 230 are driven individually, two selection lines provided for each row amount to a huge number of lines.

In the solid-state imaging device 200, by contrast, only one selection line is needed for each row because the columns are selected by controlling the switches 251 to 254. Thus, compared with the comparative example, the number of lines inside the pixel array part 220 is reduced. Note that, although the switches 251 to 254 and the selection lines connected therewith need to be added, these components are disposed outside the pixel array part 220 and do not affect the number of lines inside the pixel array part 220.

Furthermore, in the solid-state imaging device 230, one vertical signal line 229-*ms* is shared by two columns. This translates into a smaller number of signal lines and a higher degree of layout freedom than in the case where the vertical signal line is disposed for each column.

Note that, although one AD converter 271 is shared by two adjacent columns in this example, one AD converter 271 may alternatively be shared by three or more adjacent columns.

Also, in FIG. 5, the signal lines transmitting the column selection signals SELXm and XSELXm are disposed horizontally for reasons of descriptive convenience. In some cases, however, the number of signal lines disposed in the horizontal direction may be limited due to line speed control, for example. For this reason, it is preferred that the signal lines transmitting the column selection signals SELXm and XSELXm be disposed in the vertical direction.

Figure 6:
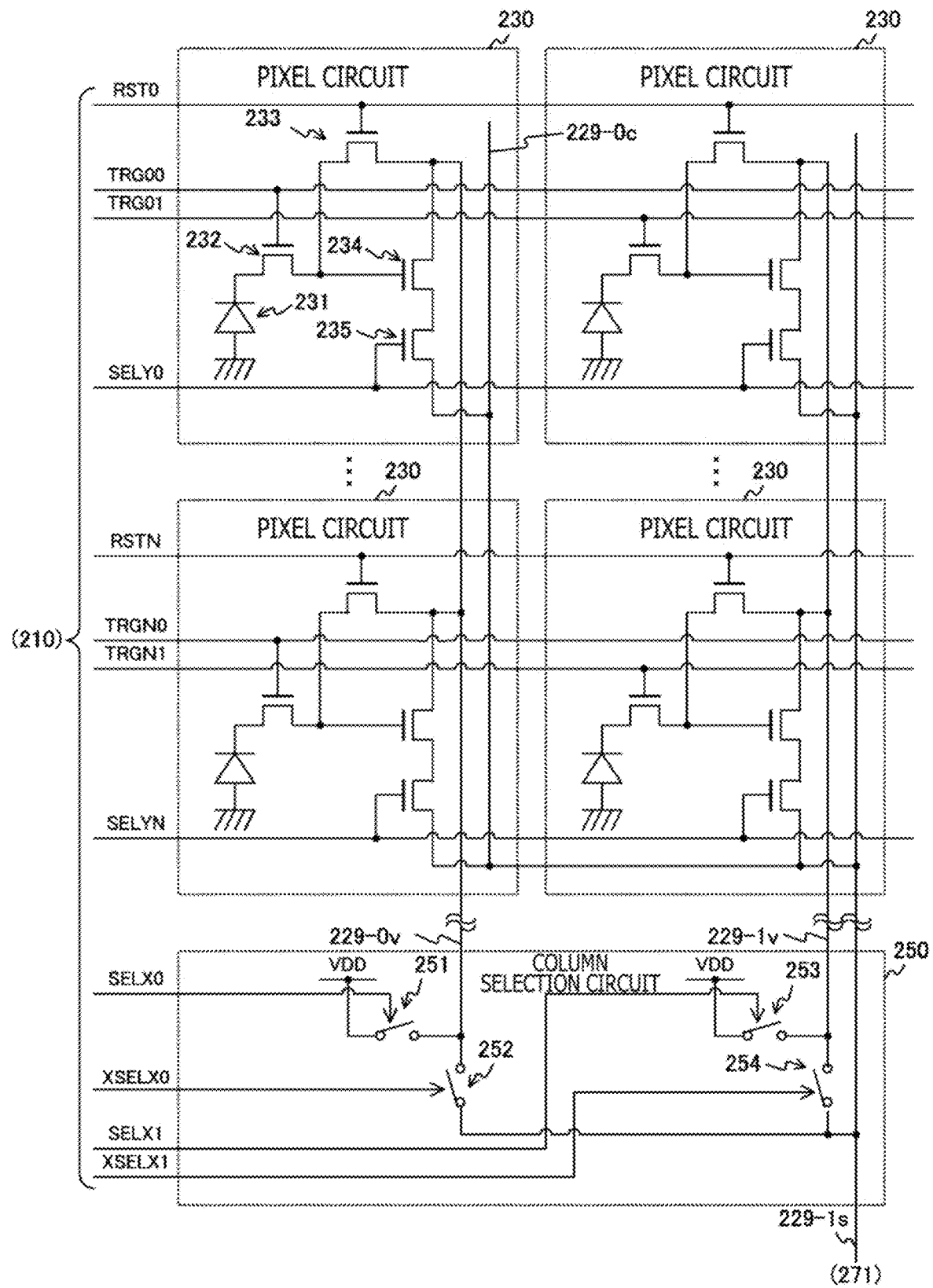
FIG. 6 is a circuit diagram depicting a typical configuration of pixel circuits with added lines and a column selection circuit in the first embodiment of the present technology.

FIG. 6 is a circuit diagram depicting a typical configuration of the pixel circuits with added lines and the column selection circuit in the first embodiment. As depicted in FIG. 6, the vertical signal lines 229-*ms* (e.g., 229-Os) may be added to the odd-numbered columns. In this case, the selection transistors 235 of the pixel circuits 230 in an odd-numbered column are commonly connected to the vertical signal line 229-*ms* of that column. Also, the vertical signal line of an odd-numbered column is connected with the vertical signal line of an adjacent odd-numbered column inside the pixel array part 220. Note that the vertical signal line of an odd-numbered column and the vertical signal line of an even-numbered column may be led out of the pixel array part 220 (e.g., near the column selection circuit 250) and connected with each other, instead of being connected with each other inside the pixel array part 220.

Figure 7:
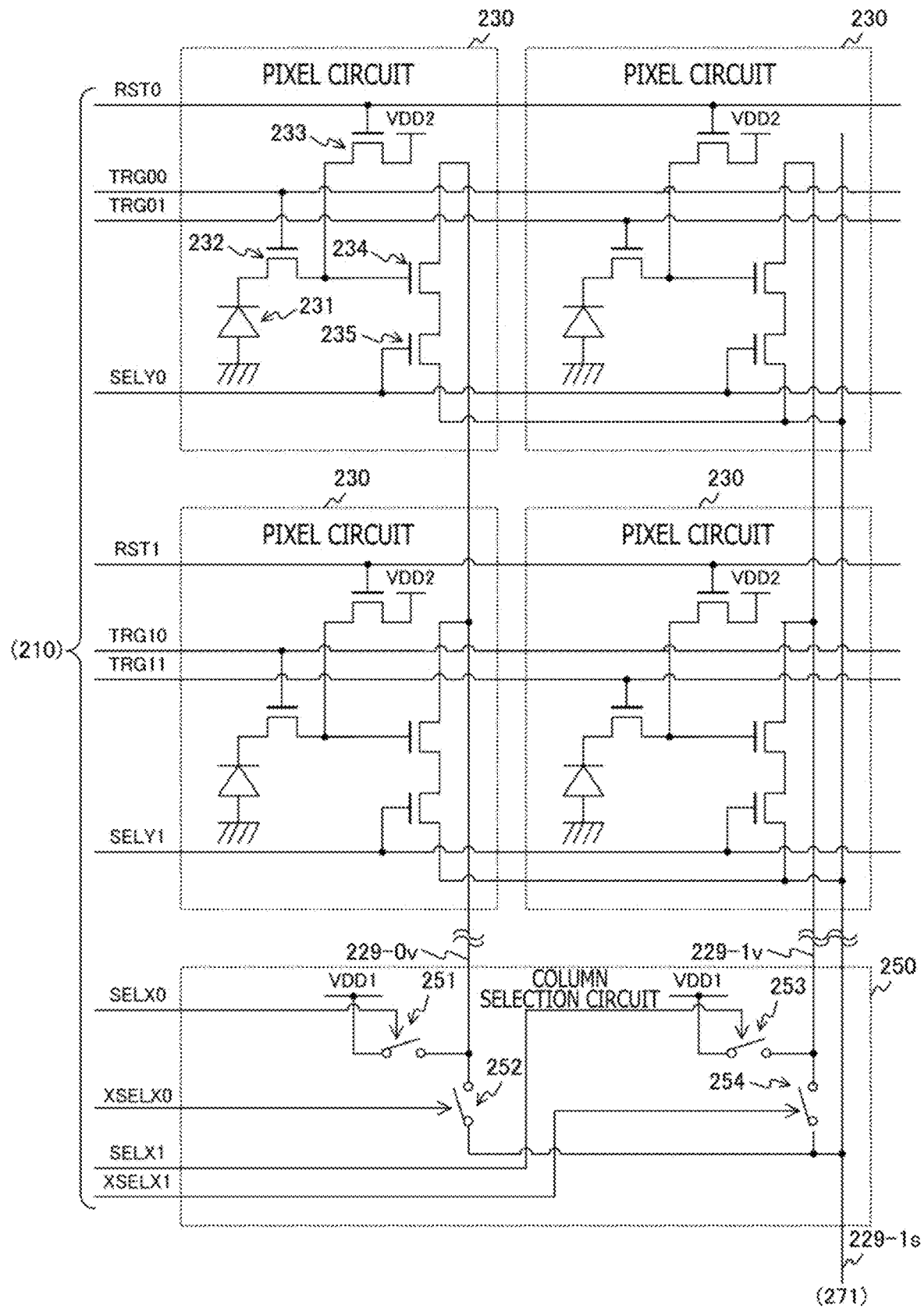
FIG. 7 is a circuit diagram depicting a typical configuration of pixel circuits to which a reset power supply is separately provided in addition to an amplifier power supply in the first embodiment of the present technology.

FIG. 7 is a circuit diagram depicting a typical configuration of the pixel circuits 230 to which a reset power supply is separately provided in addition to an amplifier power supply in the first embodiment. In the case of FIG. 5, the power supply for the amplification transistor 234 (amplifier power supply) is also used as the reset power supply for initializing the floating diffusion layer. Alternatively, as illustrated in FIG. 7, a reset power supply may be separately provided in addition to the amplifier power supply. For example, the amplifier power supply supplies a voltage VDD1, and the reset power supply supplies a power supply voltage VDD2. The reset transistor 233 is connected with the reset power supply (VDD2), and the amplification transistor 234 is connected with the amplifier power supply (VDD1) via the power supply line 229-*mv*.

Figure 8:
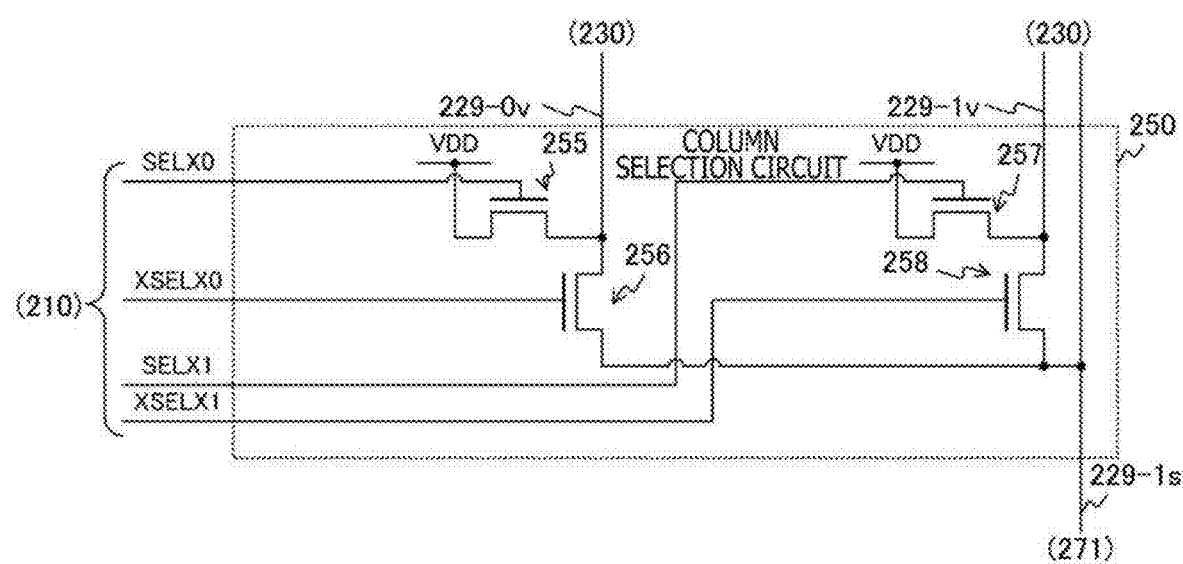
FIG. 8 is a circuit diagram depicting a typical configuration of a column selection circuit in the first embodiment of the present technology.

FIG. 8 is a circuit diagram depicting a typical configuration of the column selection circuit 250 in the first embodiment. For example, N-type MOS transistors 255, 256, 257 and 258 are used as the switches 251, 252, 253 and 254, respectively.

Alternatively, P-type MOS transistors may be used in place of the N-type MOS transistors. In a case where P-type MOS transistors are used, the High and the Low levels of the column selection signal need only be inverted. As another alternative, N-type and P-type MOS transistors may coexist. For example, the switches 251 and 253 may be N-type MOS transistors while the switches 252 and 254 may be P-type MOS transistors. In this case, the column selection signal SELXm is commonly input to these switches.

Figure 9:
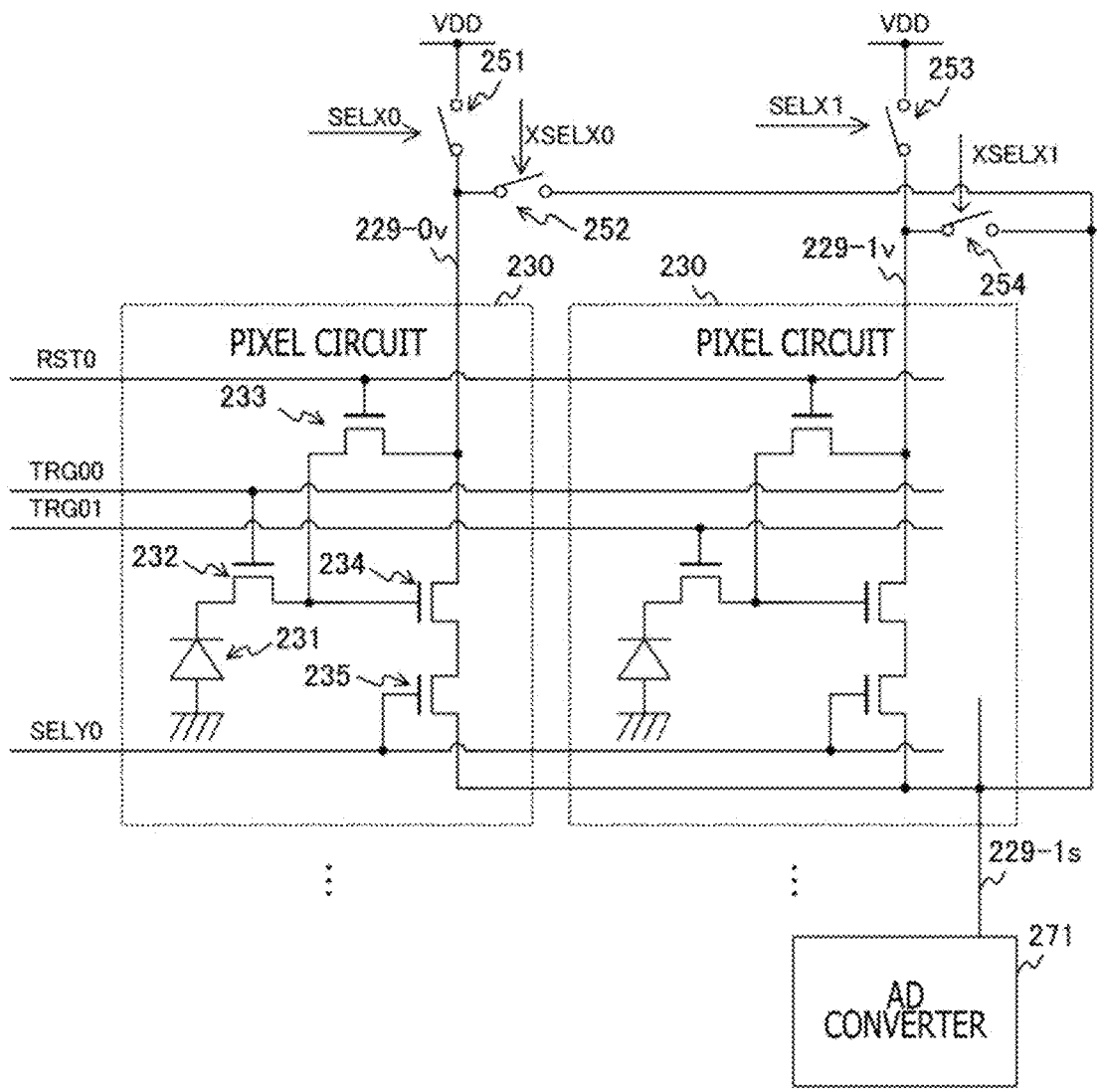
FIG. 9 is a circuit diagram depicting a typical configuration of pixel circuits and a column selection circuit in a different layout in the first embodiment of the present technology.

FIG. 9 is a circuit diagram depicting a typical configuration of the pixel circuits 230 and the column selection circuit 250 in a different layout in the first embodiment. The switch 251 opens and closes a path between the power supply line 229-0*v* and the power supply in accordance with a column selection signal SELX0, for example. Also, the switch 253 opens and closes a path between the power supply line 229-1*v* and the power supply in accordance with a column selection signal SELX1, for example. The switches 251 and 253 allow the solid-state imaging device 200 to control whether or not to supply power selectively to each of the columns.

Meanwhile, the switch 252 opens and closes a path between the power supply line 229-0*v* and the vertical signal line 229-1*s* in accordance with a column selection signal XSELX0, for example. The switch 254 opens and closes a path between the power supply line 229-1*v* and the vertical signal line 229-1*s* in accordance with a column selection signal XSELX1. The switches 252 and 254 allow the solid-state imaging device 200 to short-circuit the path between the power supply line and the vertical signal line selectively for each of the columns.

Figure 10:
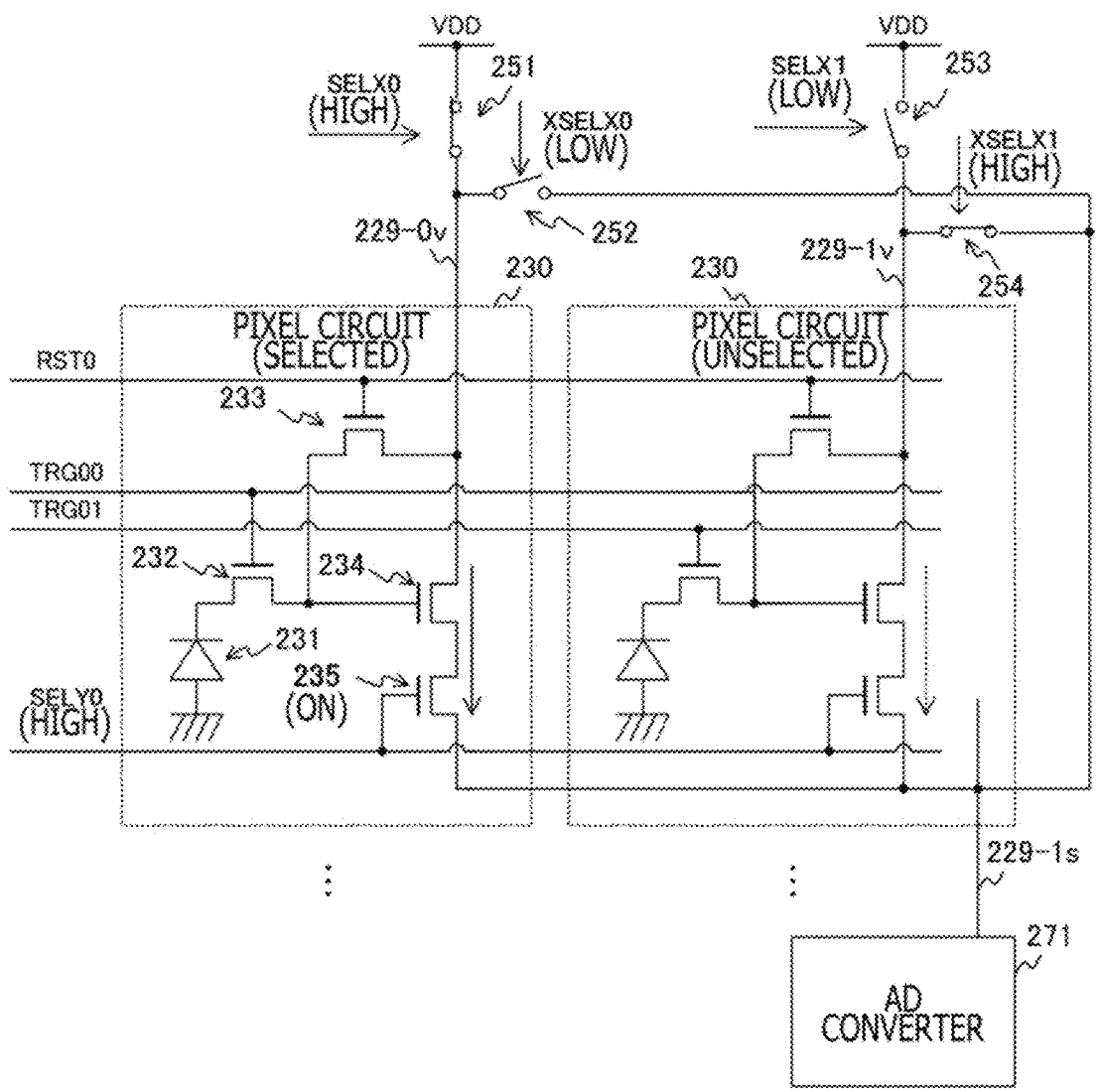
FIG. 10 is a schematic diagram depicting a typical state of a column selection circuit in selecting an odd-numbered column in the first embodiment of the present technology.

FIG. 10 is a schematic diagram depicting a typical state of a column selection circuit 250 in selecting an odd-numbered column in the first embodiment. It is assumed that the scanning circuit 210 selects row "0" and column "0" and unselects row "0" and column "1."

In this case, the scanning circuit 210 supplies a High-level row selection signal SELY0 to all pixel circuits 230 of row "0." Also, the scanning circuit 210 supplies a High-level column selection signal SELX0 to the switch 251 and a Low-level column selection signal XSELX0 to the switch 252. At the same time, the scanning circuit 210 supplies a Low-level column selection signal SELX1 to the switch 253 and a High-level column selection signal XSELX1 to the switch 254.

These selection signals cause the switches 251 and 254 to transition to a closed state and the switches 252 and 253 to transition to an opened state. The selection transistor 235 of row "0" and column "0" transitions to a conductive state (on-state). Meanwhile, with the power supply line 229-1*v* and the vertical signal line 229-*ms* short-circuited, a source potential and a drain potential of the selection transistor 235 of row "0" and column "1" become substantially the same. This brings about a non-conductive state (off-state). Thus, the pixel signal is output from the pixel circuit 230 of the selected row "0" and column "0," whereas no pixel signal is output from the pixel circuit 230 of the unselected row "0" and column "1."

Here, suppose that only the switches 251 and 253 are provided and that the switches 252 and 254 for achieving the short-circuit are not provided. In this case, the potential of the power supply line 229-1*v* of the unselected column is in a floating state. Also, because a High-level row selection signal SELY0 is supplied to the pixel circuit 230 of the unselected column, the selection transistor 235 of the unselected column is in an on-state. This can result in a pixel signal being output from the unselected column. By contrast, in a configuration in which the switches 252 and 254 are provided, these switches control the source potential and the drain potential of the selection transistor 235 of the unselected column substantially to the same level. This prevents the pixel circuit 230 of the unselected column from outputting the pixel signal.

Figure 11:
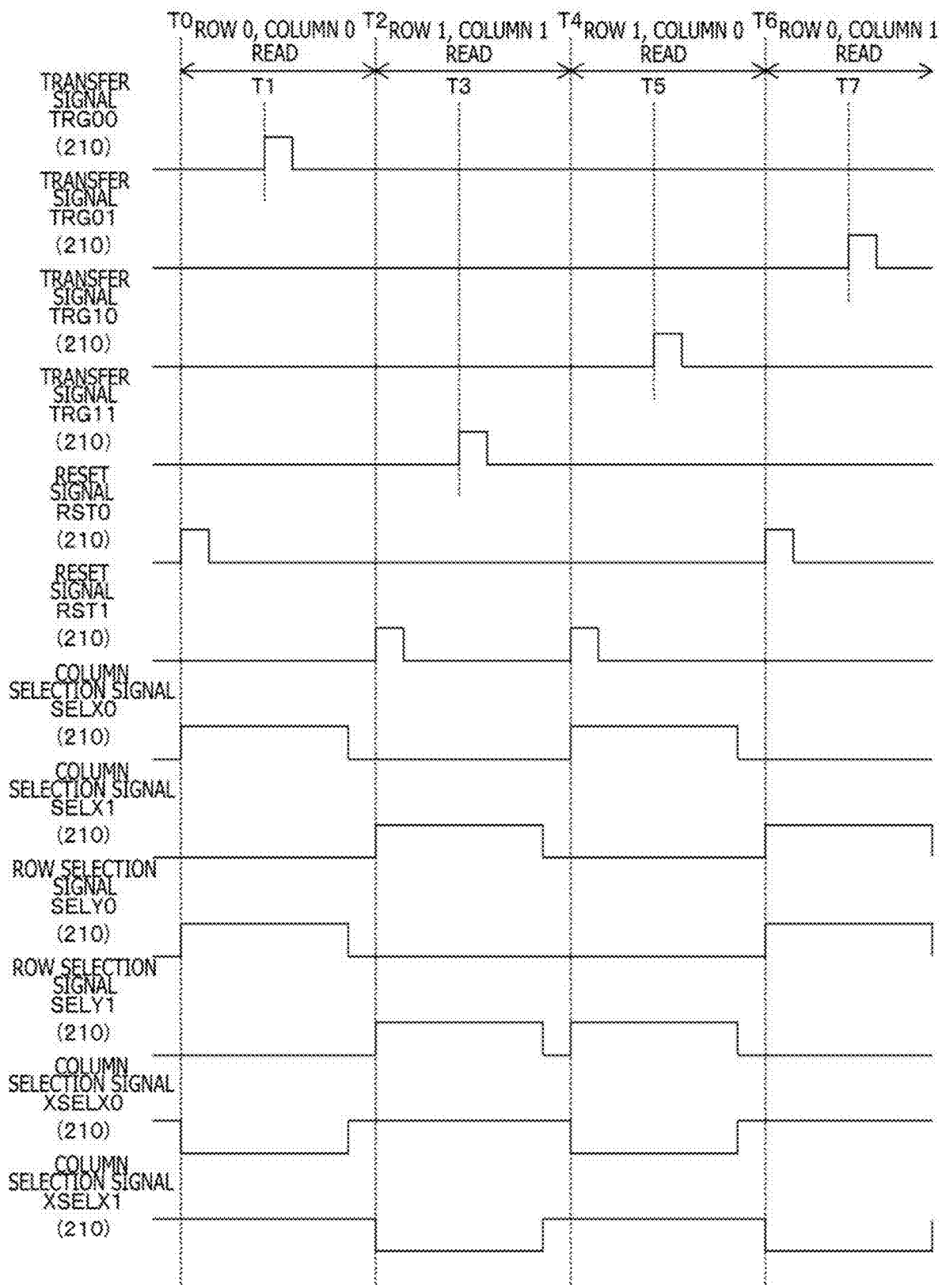
FIG. 11 is a timing chart depicting typical performance of a scanning circuit in the first embodiment of the present technology.

FIG. 11 is a timing chart depicting typical performance of the scanning circuit 210 in the first embodiment. At timing T0, the scanning circuit 210 supplies a reset signal RST0. Also, the scanning circuit 210 sets the column selection signal SELY0, the row selection signal SELY0, and the column selection signal XSELX1 High. At timing T1, the scanning circuit 210 supplies the transfer signal TRG00. These controls cause the pixel signal to be read from the pixel circuit 230 of row 0, column 0.

Next at timing T2, the scanning circuit 210 supplies a reset signal RST1. Also, the scanning circuit 210 sets the column selection signal SELX1, row selection signal SELY1, and column selection signal XSELX0 High. At timing T3, the scanning circuit 210 supplies the transfer signal TRG11. These controls cause the pixel signal to be read from the pixel circuit 230 of row 1, column 1.

Next at timing T4, the scanning circuit 210 supplies the reset signal RST1. Also, the scanning circuit 210 sets the column selection signal SELX0, the row selection signal SELY1, and the column selection signal XSELX1 High. At timing T5, the scanning circuit 210 supplies the transfer signal TRG10. These controls cause the pixel signal to be read from the pixel circuit 230 of row 1, column 0.

At timing T6, the scanning circuit 210 supplies the reset signal RST0. Also, the scanning circuit 210 sets the column selection signal SELX1, the row selection signal SELY0, and the column selection signal XSELX0 High. At timing T7, the scanning circuit 210 supplies the transfer signal TRG01. These controls cause the pixel signal to be read from the pixel circuit 230 of row 0, column 1.

Note that the solid-state imaging device 200 may read the pixel signals from part or all of the pixels within the pixel array part 220. For example, when generating image data of low resolution, the solid-state imaging device 200 need only thin out the rows or the columns when reading the pixel signals therefrom.

Also, the solid-state imaging device 200 may read the pixel signals in a certain sequence or in a random manner. For example, in the medical field, attention is drawn to the technique called compressive sensing by which observation target data (e.g., image data) is assumed to be sparse in certain representation spaces, so that the target is reconstructed from limited observation data. Using compressive sensing, the solid-state imaging device 200 may randomly read a portion of all the pixels (e.g., 25% of the entirety) to let the downstream image processing part 120 reconstruct the entire image data from the readout image data. This permits high-speed imaging.

[Typical Performance of Solid-State Imaging Device]

Figure 12:
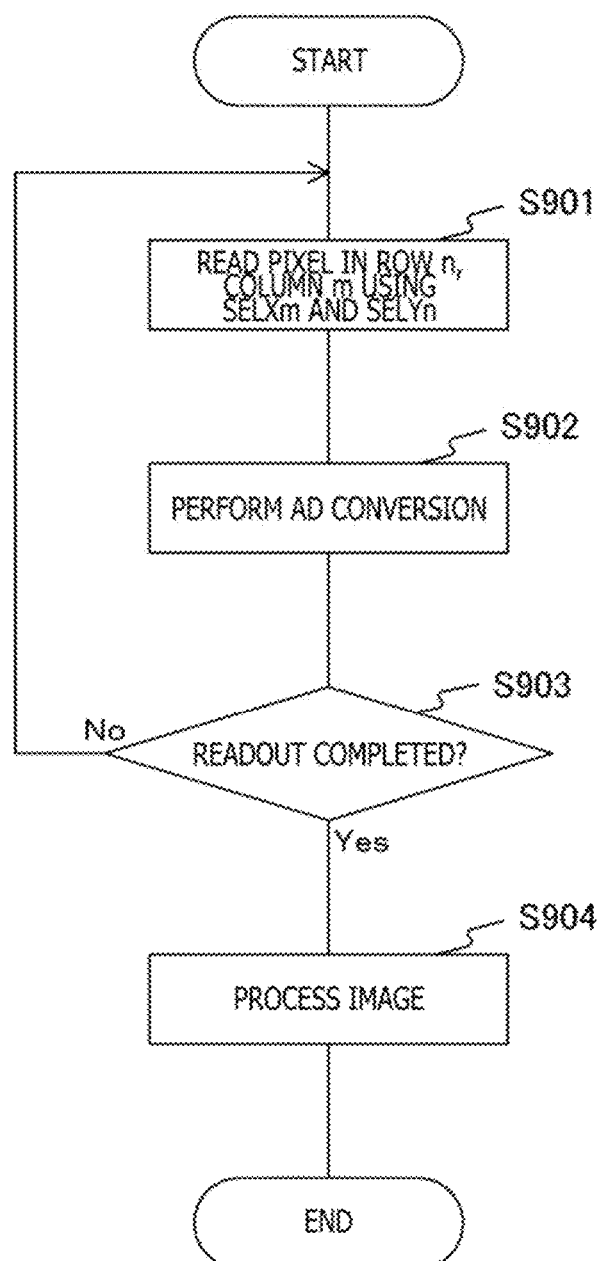
FIG. 12 is a flowchart depicting typical performance of the solid-state imaging device in the first embodiment of the present technology.

FIG. 12 is a flowchart depicting typical performance of the solid-state imaging device 200 in the first embodiment. The performance is started when, for example, an operation to capture an image (e.g. pushing of a shutter button) is carried out.

The scanning circuit 210 reads the pixel signal by selecting the pixel of row n, column m using the column selection signal SELXm and the row selection signal SELYn (step S901). The AD conversion part 270 then performs AD conversion on the pixel signal (step S902). The solid-state imaging device 200 determines whether or not all pixel signals of the readout target have been read out (step S903). Here, the pixels of the readout target may be part or all of the pixels in the pixel array part 220.

In a case where the readout is not complete (No in step S903), the solid-state imaging device 200 repeats step S901 and subsequent steps. On the other hand, in the case where the readout is complete (Yes in step S903), the solid-state imaging device 200 performs image processing (step S904) and ends the performance for imaging.

As described above, according to the first embodiment of the present technology, the column selection circuit 250 opens and closes the path between each of a plurality of power supply lines and the power supply and the path between each of the power supply lines and the vertical signal line. This allows an entire row to be selected by the row selection signal while causing the selected column alone to output the pixel signal. This configuration need only dispose, for each row, one selection line transmitting the row selection signal. This reduces the number of lines in the pixel array part 220.

2. Second Embodiment

In the above-described first embodiment, all circuits in the solid-state imaging device 200 (e.g., the pixel array part 220 and the column selection part 240) are arranged on a single semiconductor substrate. Where resolution is desired to be improved under constraints of a certain optical size (of the pixel array part 220), the pixels need to be miniaturized. The miniaturization increases the number of AD converters, thereby increasing a circuit area, such as a circuit area of the AD converters, other than the pixel. That is, an area of the semiconductor substrate is increased. In view of this, the solid-state imaging device 200 is layered on a plurality of semiconductor substrates. The pixel array part 220 is then arranged on one of these substrates, with the remaining parts disposed on the remaining substrates. This arrangement translates into a smaller semiconductor substrate area than a case where the imaging device is not layered. The solid-state imaging device 200 in the second embodiment differs from the first embodiment in that the solid-state imaging device 200 is implemented in a multilayer structure to reduce the semiconductor substrate area.

Figure 13:
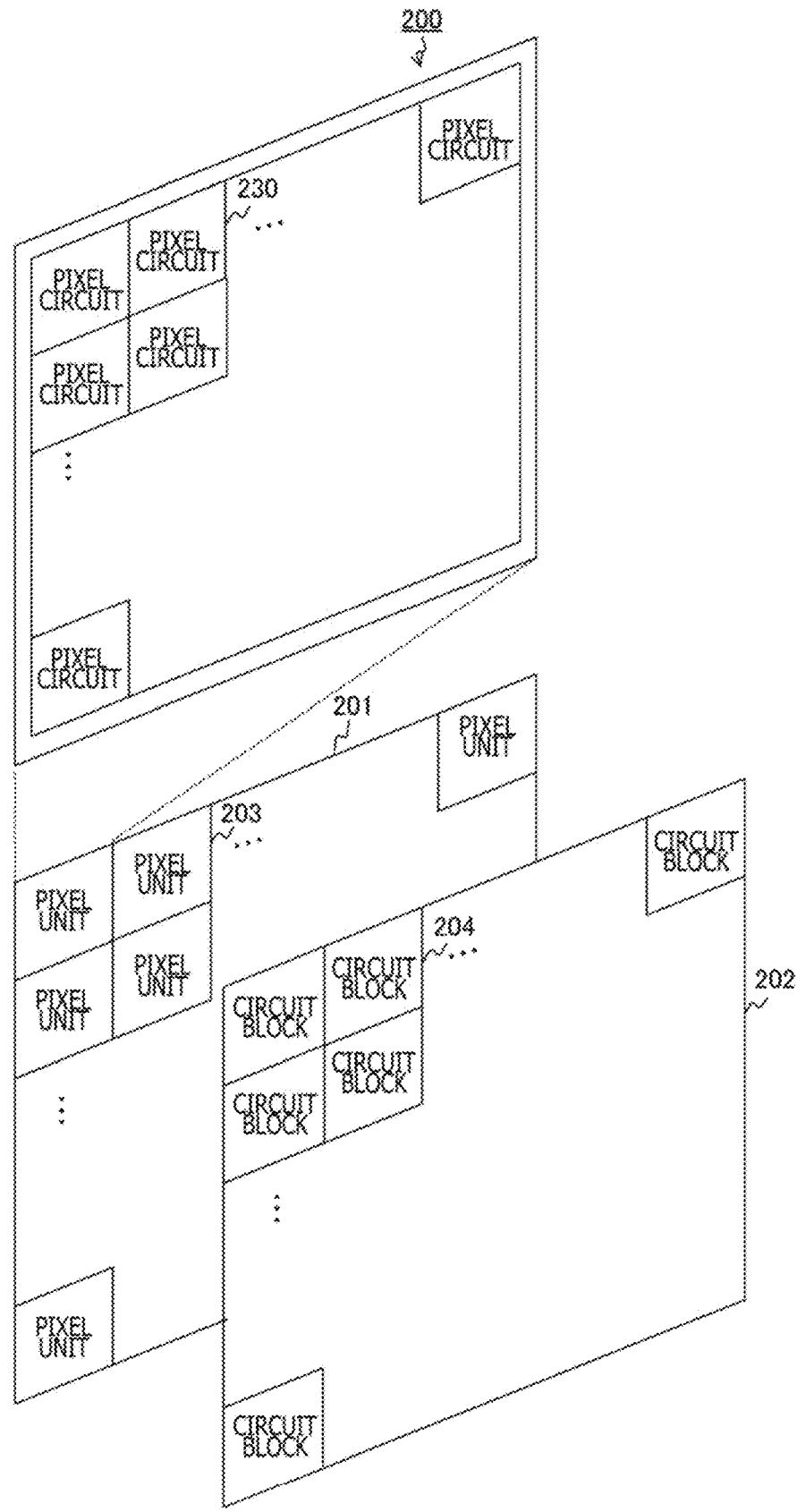
FIG. 13 is a typical perspective diagram of a solid-state imaging device in a second embodiment of the present technology.

FIG. 13 is a typical perspective diagram of the solid-state imaging device 200 in the second embodiment. The solid-state imaging device 200 of the second embodiment includes a lower semiconductor substrate 202 and an upper semiconductor substrate 201 layered over the lower substrate.

On the upper semiconductor substrate 201, a plurality of pixel units 203 are arrayed in a two-dimensional grid-like pattern. In each of the pixel units 203, a plurality of pixel circuits 230 are arrayed in a two-dimensional grid-like pattern.

On the lower semiconductor substrate 202, as many circuit blocks 204 as the number of pixel units 203 are arranged in a two-dimensional grid-like pattern. The pixel units 203 are connected with the circuit blocks 204 on a one-to-one basis unit using a through-silicon via (TSV), a bump, or Cu—Cu connection, for example.

Also, on the lower semiconductor substrate 202, the scanning circuit 210, the timing control part 260, and the transfer control circuit 280 are arranged. Note that, in FIG. 13, the scanning circuit 210, timing control part 260, and transfer control circuit 280 are not depicted.

Figure 14:
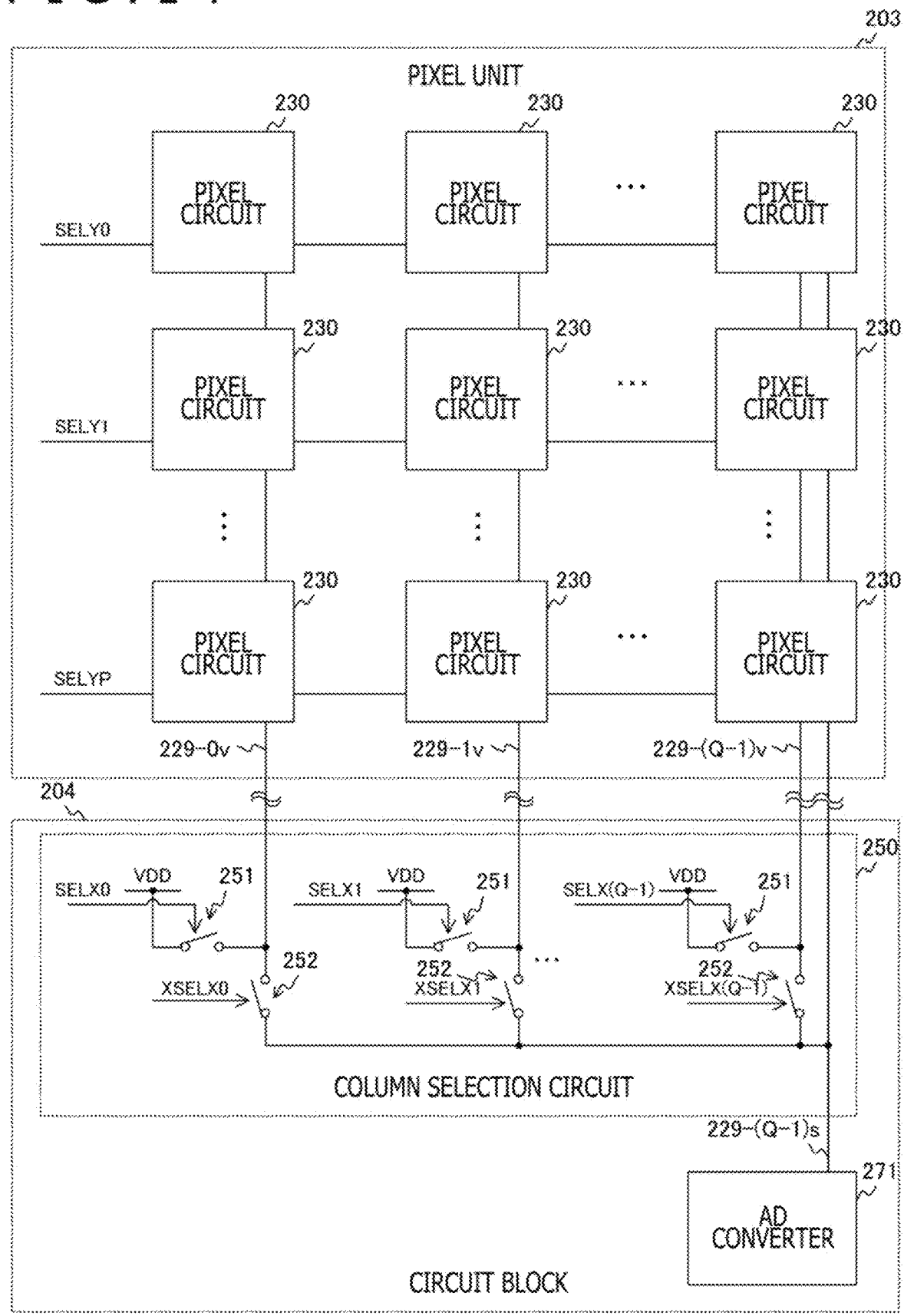
FIG. 14 is a block diagram depicting a typical configuration of a pixel unit and a circuit block in the second embodiment of the present technology.

FIG. 14 is a block diagram depicting a typical configuration of the pixel unit 203 and the circuit block 204 in the second embodiment. In the pixel unit 203, the pixel circuits 230 of P rows by Q columns (P and Q are each an integer of at least 2) are arranged. Each of the columns is provided with a power supply line 229-$qv$ (q is an integer of 0 to Q−1). Column Q−1 is provided with a vertical signal line 229-(Q−1)s. The vertical signal line 229-(Q−1)s is commonly connected to the selection transistors of all pixel circuits 230 in the pixel unit 203. The pixel circuits 230 in the second embodiment are configured the same as in the first embodiment.

The column selection circuit 250 and the AD converter 271 are arranged in the circuit block 204. The column selection circuit 250 has switches 251 and 252 provided for each column. The switch 251 opens and closes the path between the power supply line 229-$qv$ and the power supply in accordance with a column selection signal SELXq. Also, the switch 252 opens and closes the path between the power supply line 229-*qv* and the vertical signal line 229-(Q−1)s in accordance with a column selection signal XSELXq.

Note that, although the column selection circuit 250 is arranged in each circuit block 204 on the lower semiconductor substrate 202 in this example, the column selection circuit 250 may alternatively be arranged on the upper semiconductor substrate 201. Also, whereas two semiconductor substrates are layered one on top of the other in this example, three or more substrates may alternatively be layered to let the circuits of the solid-state imaging device 200 be arranged in a distributed manner over the layered substrates.

According to the second embodiment of the present technology, as described above, the circuits inside the solid-state imaging device 200 are arranged in distributed manner over the two layered semiconductor substrates. This arrangement thus translates into a smaller semiconductor substrate area than the case adopting a single semiconductor substrate.

3. Third Embodiment

In the above-described first embodiment, the floating diffusion layer and the reset transistor 233 are provided for each pixel circuit 230. However, in order to facilitate miniaturization of the pixels, it is preferred to reduce the circuit size per pixel. The solid-state imaging device 200 in the third embodiment differs from the first embodiment in that a circuit size of the pixel circuits 230 is reduced.

Figure 15:
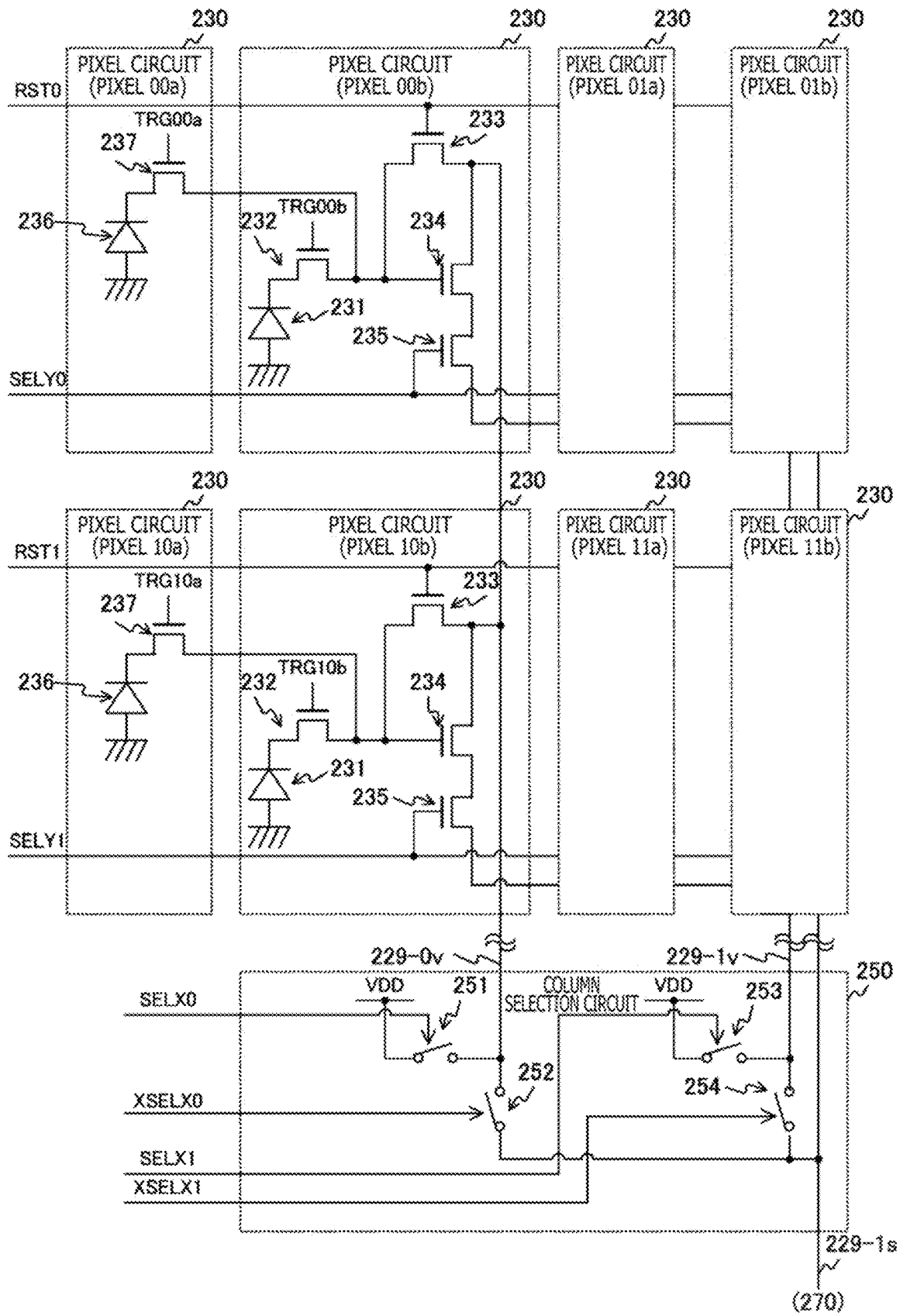
FIG. 15 is a circuit diagram depicting a typical configuration of pixel circuits and a column selection circuit in a third embodiment of the present technology.

FIG. 15 is a circuit diagram depicting a typical configuration of the pixel circuits 230 and the column selection circuit 250 in the third embodiment.

The pixel circuit 230 of an even-numbered column includes a photoelectric conversion element 231, a transfer transistor 232, a floating diffusion layer, a reset transistor 233, an amplification transistor 234, and a selection transistor 235. The pixel circuit 230 of an odd-numbered column, on the other hand, has only a photoelectric conversion element 236 and a transfer transistor 237. The two adjacent pixel circuits 230 share the floating diffusion layer, the reset transistor 233, the amplification transistor 234, and the selection transistor 235.

It is assumed that a pair of pixels sharing the left side of row 0 in the floating diffusion layer of N rows by 2 columns are pixels 00*a* and 00*b* and that a pair of pixels sharing the right side of row 0 are pixels 01*a* and 01*b*. It is also assumed that a pair of pixels sharing the left side of row 1 in the floating diffusion layer of N rows by 2 columns are pixels 10*a* and 10*b* and that a pair of pixels sharing the right side of row 1 are pixels 11*a* and 11*b*. The pixels 00*a*, 00*b*, 01*a*, 01*b*, 10*a*, 10*b*, 11*a*, and 11*b* are supplied with transfer signals TRG00*a*, TRG00*b*, TRG01*a*, TRG01*b*, TRG10*a*, TRG10*b*, TRG11*a*, and TRG11*b*, respectively. In the following, likewise, row n is supplied with transfer signals TRGn0*a*, TRG00*b*, TRGn1*a*, and TRGn1*b*, and so on.

Note that, although two adjacent pixels share the floating diffusion layer and other parts in this example, three or more adjacent pixels may share the floating diffusion layer and other parts.

Figure 16:
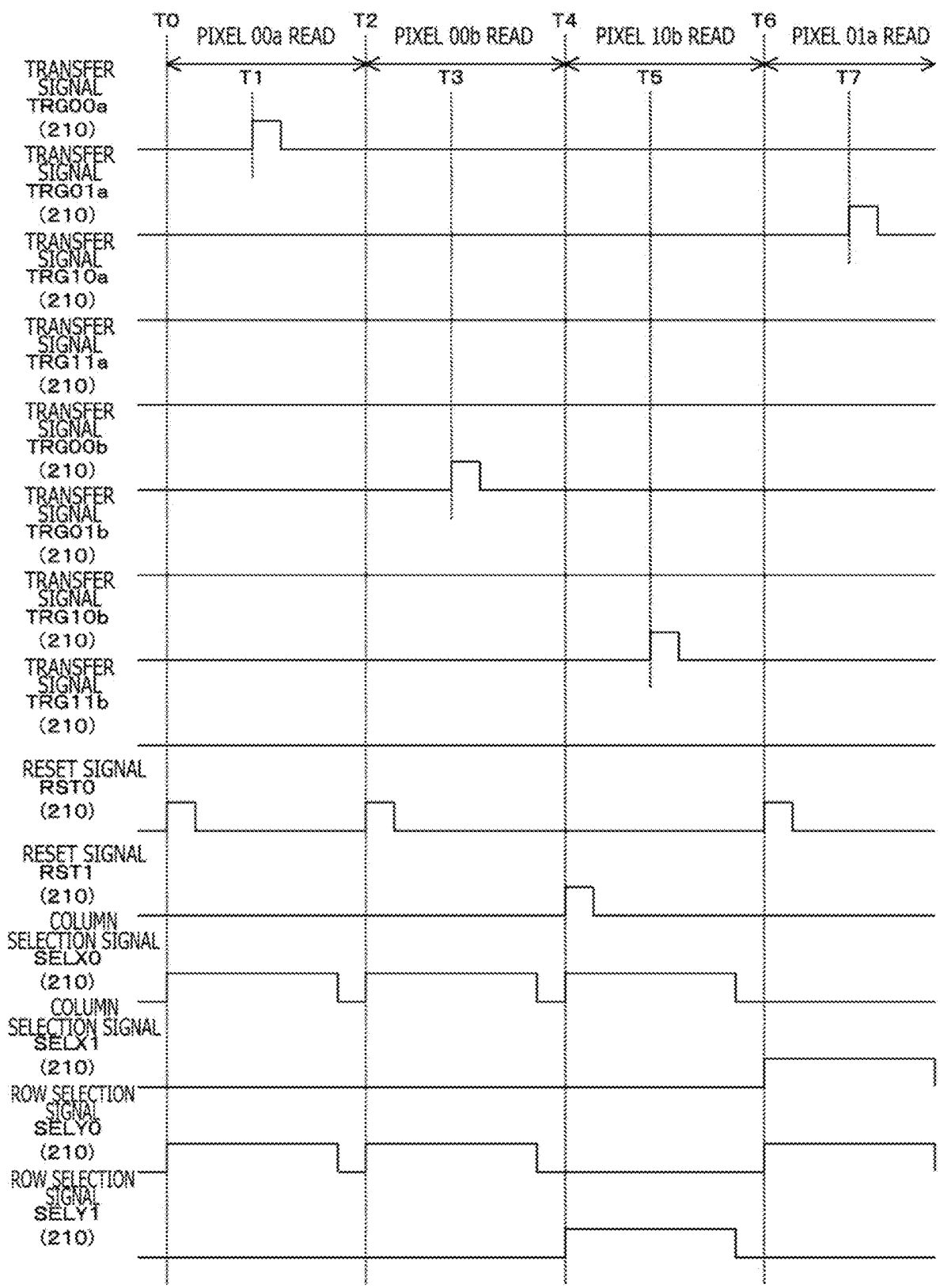
FIG. 16 is a timing chart depicting typical performance of a vertical scanning circuit in the third embodiment of the present technology.

FIG. 16 is a timing chart depicting typical performance of a vertical scanning circuit in the third embodiment. At timing T0, the scanning circuit 210 supplies the reset signal RST0. Also, the scanning circuit 210 sets the column selection signal SELX0 and the row selection signal SELY0 High. The column selection signal XSELXm is not depicted in the timing chart. At timing T1, the scanning circuit 210 supplies the transfer signal TRG00*a*. These controls cause the pixel signal of the pixel 00*a* to be read out.

Next at timing T2, the scanning circuit 210 supplies the reset signal RST0. Also, the scanning circuit 210 sets the column selection signal SELX0 and the row selection signal SELY0 High. At timing T3, the scanning circuit 210 supplies the transfer signal TRG00*b*. These controls cause the pixel signal of the pixel 00*b* to be read out.

At timing T4, the scanning circuit 210 supplies the reset signal RST1. Also, the scanning circuit 210 sets the column selection signal SELX0 and the row selection signal SELY1 High. At timing T5, the scanning circuit 210 supplies the transfer signal TRG10*b*. These controls cause the pixel signal of the pixel 10*b* to be read out.

Next at timing T6, the scanning circuit 210 supplies the reset signal RST0. Also, the scanning circuit 210 sets the column selection signal SELX1 and the row selection signal SELY0 High. At timing T7, the scanning circuit 210 supplies the transfer signal TRG01*a*. These controls cause the pixel signal of the pixel 01*a* to be read out.

According to the third embodiment of the present technology, as described above, a plurality of adjacent pixels share the floating diffusion layer and other parts. This translates into a smaller circuit size of the pixel circuits 230 than the case where such sharing does not exist.

Note that the embodiments described above are merely examples in which the present technology may be implemented. The matters of the embodiments correspond to the matters used to specify the invention in the appended claims. Likewise, the matters used to specify the invention named in the appended claims correspond to the matters of the embodiments with the same names in the foregoing description of the preferred embodiments of the present technology. However, the present technology is not limited to the foregoing embodiments and may be implemented by applying various modifications and alterations to the embodiments within the scope of the appended claims.

Note that the advantageous effects mentioned in this description are not limitative of the present disclosure. Further advantages will become apparent from a reading of the present disclosure.

Note that the present technology may be configured preferably as follows:

(1) A solid-state imaging device including:

a plurality of pixel circuits each connected with one of a plurality of power supply lines disposed in a direction perpendicular to a predetermined direction;

a signal processing part processing a pixel signal that is output via a signal line commonly connected with a predetermined number of adjacent pixel circuits in the predetermined direction from among the plurality of pixel circuits;

a power path opening/closing part opening and closing a path between each of the plurality of power supply lines and a power supply; and a signal path opening/closing part opening and closing a path between each of the plurality of power supply lines and the signal line.

(2) The solid-state imaging device as stated in paragraph (1) above, further including:

a scanning circuit performing a process of driving the pixel circuits arrayed in the predetermined direction to output the pixel signal and a process of selecting the predetermined number of pixel circuits one after another.

(3) The solid-state imaging device as stated in paragraph (2) above, in which the power path opening/closing part performs control to bring into a closed state the path between the power supply line connected with the selected pixel circuit from among the plurality of power lines, and the power supply, and the signal path opening/closing part performs control to bring into an opened state the path between the power supply line connected with the selected pixel circuit from among the plurality of power supply lines, and the signal line.

(4) The solid-state imaging device as stated in any of paragraphs (1) to (3) above, in which the plurality of power supply lines, the plurality of pixel circuits, and the signal line are arranged on a predetermined semiconductor substrate, and the signal processing part is arranged on a semiconductor substrate layered on the predetermined semiconductor substrate.

(5) The solid-state imaging device as stated in paragraph (4) above, in which the power path opening/closing part and the signal path opening/closing part are arranged on the layered semiconductor substrate.

(6) The solid-state imaging device as stated in paragraph (4) above, in which the power path opening/closing part and the signal path opening/closing part are arranged on the predetermined semiconductor substrate.

(7) The solid-state imaging device as stated in any of paragraphs (1) to (6) above, in which a certain number of adjacent pixel circuits from among the plurality of pixel circuits share a floating diffusion layer, the floating diffusion layer accumulates photoelectrically converted electrical charges to generate a voltage reflecting an amount of the electrical charges, and the pixel signal is a signal that reflects the voltage.

(8) The solid-state imaging device as stated in any of paragraphs (1) to (7) above, in which the plurality of pixel circuits each include
 a photoelectric conversion element converting light into electrical charges,
 a floating diffusion layer accumulating the electrical charges to generate a voltage reflecting the amount of the electrical charges,
 a reset transistor initializing the amount of the electrical charges accumulated in the floating diffusion layer, and
 an amplification transistor outputting a signal reflecting the voltage as the pixel signal, and the amplification transistor is connected with the power supply and the reset transistor is connected with a reset power supply different from the power supply.

(9) The solid-state imaging device as stated in any of paragraphs (1) to (8) above, in which the signal processing part performs analog-to-digital conversion on the pixel signal.

(10) An imaging apparatus including:

a plurality of pixel circuits each connected with one of a plurality of power supply lines disposed in a direction perpendicular to a predetermined direction;

a signal processing part processing a pixel signal that is output via a signal line commonly connected with a predetermined number of adjacent pixel circuits in the predetermined direction from among the plurality of pixel circuits;

a power path opening/closing part opening and closing a path between each of the plurality of power supply lines and a power supply;

a signal path opening/closing part opening and closing a path between each of the plurality of power supply lines and the signal line; and a recording part recording image data generated from the processed pixel signal.

(11) A method of controlling a solid-state imaging device, the method including:

a signal processing step of processing a pixel signal that is output via a signal line commonly connected with a predetermined number of adjacent pixel circuits in a predetermined direction from among a plurality of pixel circuits each connected with one of a plurality of power supply lines disposed in a direction perpendicular to the predetermined direction;

opening and closing a path between each of the plurality of power supply lines and a power supply; and opening and closing a path between each of the plurality of power supply lines and the signal line.

REFERENCE SIGNS LIST

100 Imaging apparatus
110 Imaging lens
120 Image processing part
130 Imaging control part
140 Recording part
200 Solid-state imaging device
201 Upper semiconductor substrate
202 Lower semiconductor substrate
203 Pixel unit
204 Circuit block
210 Scanning circuit
220 Pixel array part
230 Pixel circuit
231, 236 Photoelectric conversion element
232, 237 Transfer transistor
233 Reset transistor
234 Amplification transistor
235 Selection transistor
240 Column selection part
250 Column selection circuit
251, 252, 253, 254 Switch
255, 256, 257, 258 MOS transistor
260 Timing control part
270 AD conversion part
271 AD converter
280 Transfer control circuit

The invention claimed is:

1. A solid-state imaging device comprising:
 a plurality of pixel circuits each connected with one of a plurality of power supply lines disposed in a direction perpendicular to a predetermined direction;
 a signal processing part processing a pixel signal that is output via a signal line commonly connected with a predetermined number of adjacent pixel circuits in the predetermined direction from among the plurality of pixel circuits;
 a power path opening/closing part opening and closing a path between each of the plurality of power supply lines and a power supply; and
 a signal path opening/closing part opening and closing a path between each of the plurality of power supply lines and the signal line.

2. The solid-state imaging device according to claim 1, further comprising:
 a scanning circuit performing a process of driving the pixel circuits arrayed in the predetermined direction to output the pixel signal and a process of selecting the predetermined number of pixel circuits one after another.

3. The solid-state imaging device according to claim 2,
wherein the power path opening/closing part performs control to bring into a closed state the path between the power supply line connected with the selected pixel circuit from among the plurality of power lines, and the power supply, and the signal path opening/closing part performs control to bring into an opened state the path between the power supply line connected with the selected pixel circuit from among the plurality of power supply lines, and the signal line.

4. The solid-state imaging device according to claim 1,
wherein the plurality of power supply lines, the plurality of pixel circuits, and the signal line are arranged on a predetermined semiconductor substrate, and the signal processing part is arranged on a semiconductor substrate layered on the predetermined semiconductor substrate.

5. The solid-state imaging device according to claim 4,
wherein the power path opening/closing part and the signal path opening/closing part are arranged on the layered semiconductor substrate.

6. The solid-state imaging device according to claim 4,
wherein the power path opening/closing part and the signal path opening/closing part are arranged on the predetermined semiconductor substrate.

7. The solid-state imaging device according to claim 1,
wherein a certain number of adjacent pixel circuits from among the plurality of pixel circuits share a floating diffusion layer, the floating diffusion layer accumulates photoelectrically converted electrical charges to generate a voltage reflecting an amount of the electrical charges, and the pixel signal is a signal that reflects the voltage.

8. The solid-state imaging device according to claim 1,
wherein the plurality of pixel circuits each include
   a photoelectric conversion element converting light into electrical charges,
   a floating diffusion layer accumulating the electrical charges to generate a voltage reflecting the amount of the electrical charges,
      a reset transistor initializing the amount of the electrical charges accumulated in the floating diffusion layer, and an amplification transistor outputting a signal reflecting the voltage as the pixel signal, and the amplification transistor is connected with the power supply and the reset transistor is connected with a reset power supply different from the power supply.

9. The solid-state imaging device according to claim 1,
wherein the signal processing part performs analog-to-digital conversion on the pixel signal.

10. An imaging apparatus comprising:
a plurality of pixel circuits each connected with one of a plurality of power supply lines disposed in a direction perpendicular to a predetermined direction;

a signal processing part processing a pixel signal that is output via a signal line commonly connected with a predetermined number of adjacent pixel circuits in the predetermined direction from among the plurality of pixel circuits;

a power path opening/closing part opening and closing a path between each of the plurality of power supply lines and a power supply;

a signal path opening/closing part opening and closing a path between each of the plurality of power supply lines and the signal line; and a recording part recording image data generated from the processed pixel signal.

11. A method of controlling a solid-state imaging device, the method comprising:

a signal processing step of processing a pixel signal that is output via a signal line commonly connected with a predetermined number of adjacent pixel circuits in a predetermined direction from among a plurality of pixel circuits each connected with one of a plurality of power supply lines disposed in a direction perpendicular to the predetermined direction;

a power path opening/closing step of opening and closing a path between each of the plurality of power supply lines and a power supply; and a signal path opening/closing step of opening and closing a path between each of the plurality of power supply lines and the signal line.

* * * * *